(12) United States Patent
Farjadrad et al.

(10) Patent No.: US 7,797,613 B1
(45) Date of Patent: Sep. 14, 2010

(54) DIGITAL IMPLEMENTATION OF AN ENHANCED MINSUM ALGORITHM FOR ERROR CORRECTION IN DATA COMMUNICATIONS

(75) Inventors: Ramin Farjadrad, Mountain View, CA (US); Ramin Shirani, Morgan Hill, CA (US)

(73) Assignee: Aquantia Corporation, Milpitas, CA (US)

( * ) Notice: Subject to any disclaimer, the term of this patent is extended or adjusted under 35 U.S.C. 154(b) by 875 days.

(21) Appl. No.: 11/678,054

(22) Filed: Feb. 22, 2007

Related U.S. Application Data

(60) Provisional application No. 60/776,026, filed on Feb. 22, 2006.

(51) Int. Cl.
*H03M 13/45* (2006.01)
(52) U.S. Cl. ...................................... 714/780
(58) Field of Classification Search ............ 714/780
See application file for complete search history.

(56) References Cited

U.S. PATENT DOCUMENTS

| | | | |
|---|---|---|---|
| 7,350,130 B2 * | 3/2008 | Tran et al. ................... | 714/758 |
| 7,415,079 B2 * | 8/2008 | Cameron et al. ............ | 375/340 |
| 7,562,279 B2 * | 7/2009 | Zhang et al. ................. | 714/752 |
| 7,603,607 B2 * | 10/2009 | Maehata ...................... | 714/752 |
| 7,631,250 B2 * | 12/2009 | Liao et al. ................... | 714/800 |
| 7,716,561 B2 * | 5/2010 | Belogolovyi et al. ........ | 714/780 |
| 2007/0283213 A1* | 12/2007 | Liao et al. ................... | 714/758 |
| 2008/0082902 A1* | 4/2008 | Sun et al. .................... | 714/801 |
| 2008/0292025 A1* | 11/2008 | Efimov et al. ............... | 375/340 |

* cited by examiner

*Primary Examiner*—Stephen M Baker
(74) *Attorney, Agent, or Firm*—Sawyer Law Group, P.C.

(57) ABSTRACT

An iterative error correcting decoder is provided. In one implementation, the iterative error correcting decoder includes an equality constraint node and a parity check node, the parity check node. The parity check node includes parity logic configured to receive input data bits from the equality constraint node and determine a first minimum value and a second minimum value associated with the input data bits using a MinSum algorithm. An enhancement function is performed on the first minimum value and the second minimum value. The enhancement function compares each of the first minimum value and the second minimum value with a first pre-determined constant value, and responsive to the first minimum value and the second minimum value being smaller than the first pre-determined constant value, the enhancement function passes the first minimum value and the second minimum value without any changes as output of the MinSum algorithm.

9 Claims, 11 Drawing Sheets

Parity Serial Comparison Logic

Variable 6, 7, 8 Digit Adder

Parity & Variable Controls Timing Diagram

DIGITAL IMPLEMENTATION OF AN ENHANCED MINSUM ALGORITHM FOR ERROR CORRECTION IN DATA COMMUNICATIONS

CROSS-REFERENCE TO RELATED APPLICATIONS

This application claims benefit under 35 USC 119(e) of Provisional Application No. 60/774,906, filed on Feb. 22, 2006.

FIELD OF THE INVENTION

The present invention relates generally to data communications, and more particularly to error correction in data communications.

BACKGROUND OF THE INVENTION

Low density parity check codes (LDPCs) are error correction codes that perform near the theoretically optimal limit. Similar to most error correcting codes, the LDPC decoding implementation is more complex than that required for encoding. For LDPC decoders the sum product algorithm is optimal in terms of performance, but is computationally complex because the sum product algorithm requires the use of transcendental mathematical functions.

BRIEF SUMMARY OF THE INVENTION

In general, in one aspect, this specification describes a digital implementation of an enhanced MinSum algorithm that can be used for error correction in data communications.

Implementations can include one or more of the following features.

The details of one or more implementations are set forth in the accompanying drawings and the description below. Other features and advantages will be apparent from the description and drawings.

BRIEF DESCRIPTION OF THE DRAWINGS

Like reference symbols in the various drawings indicate like elements.

DETAILED DESCRIPTION OF THE INVENTION

Figure 1:
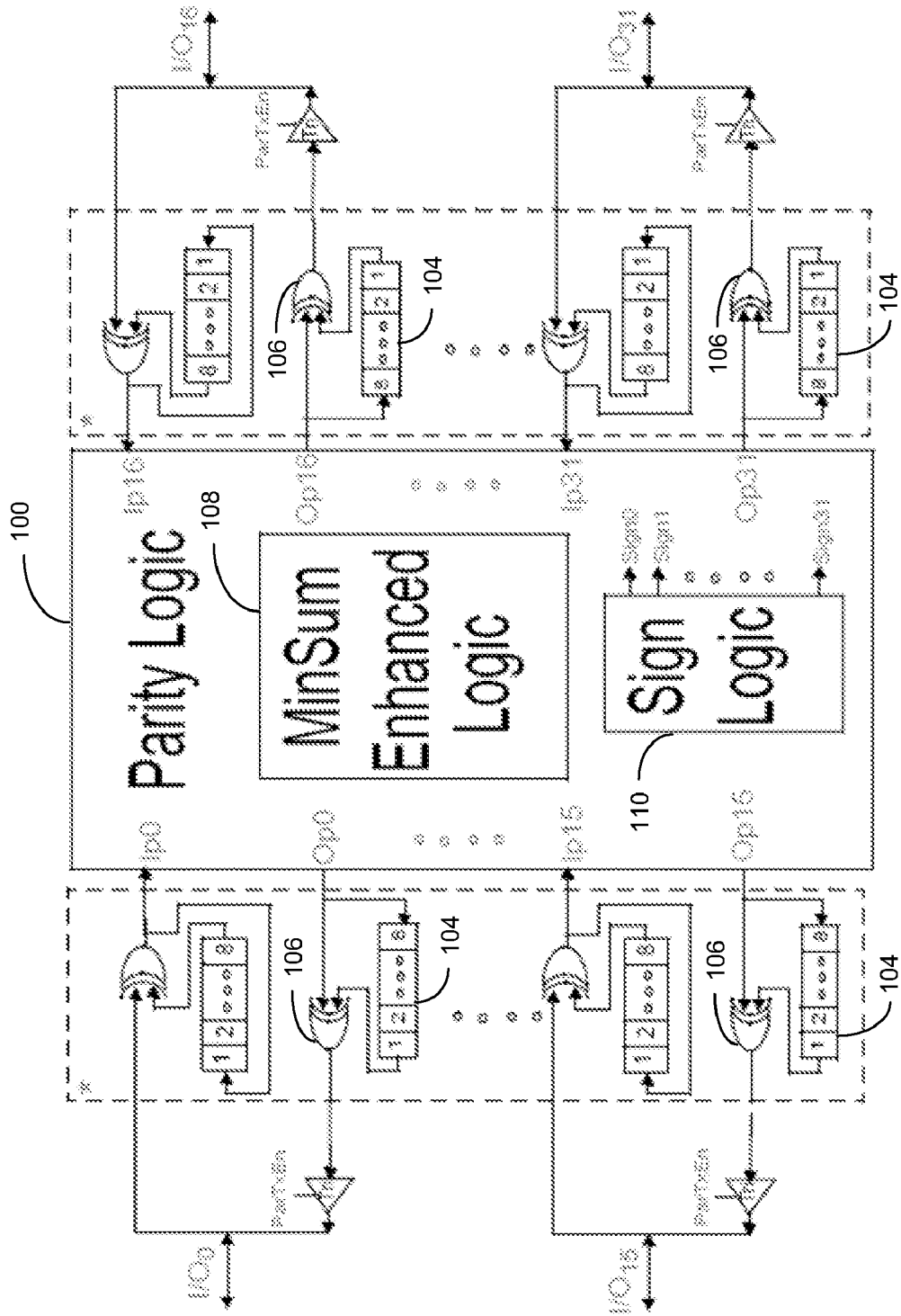
FIG. 1 is a block diagram of parity logic including an enhanced MinSum logic according to one implementation.

An error correcting decoder is typically implemented, e.g., in a network system, to reduce communication errors. One type of an error correcting decoder is an iterative error correcting decoder. Iterative error correcting decoders typically use a large-scale parallel network of nodes performing soft probability calculation. These nodes exchange probability information of a received data block among one another. After a certain number of iterations within an iterative decoder structure, individual noisy information in a data block (or word) is transformed into an estimate of the word as a whole. Examples of iterative decoders are the low density parity check (LDPC) decoders, Hamming decoders, Reed-Solomon decoders, Turbo decoders, and the like.

The structure of an iterative error correcting decoder can be represented graphically by a factor graph. A factor graph consists of nodes and edges, where the edges represent wire connections between the nodes, and a node represents a function of its inputs. For example, in a low density parity check (LDPC) factor graph, there are two types of nodes representing two distinct functions—i.e., "equality constraint" nodes and "parity check" nodes. According to the IEEE 802.3ae (10 GBASE-T) standard, the proposed LDPC decoder consists of (2048) equality constraint nodes and (384) parity check nodes. Each equality constraint node has (6) bidirectional connections to corresponding parity constraint nodes and each parity check node has a total of (32) bidirectional connections to corresponding equality constraint nodes. This results in a factor graph with network matrix of (12,228) connections. The probabilities associated with received bit values iterate between these two node functions to finally resolve the most probable value of each data bit. As discussed above, for LDPC decoders the sum product algorithm is optimal in terms of performance, but is computationally complex because the sum product algorithm requires the use of transcendental mathematical functions. One approximation to the sum product algorithm is the MinSum algorithm. The MinSum algorithm differs from sum product algorithm since the parity calculations in the parity check node are simplified. Instead of looking at the actual parity of all the incoming messages (which will require complex hyperbolic tangent functions), one can find the minimum of all of the incoming messages and use that instead. There are known degradation of the performance as a consequence of using the min sum algorithm, instead of sum product algorithm. An enhanced min sum algorithm can compensate for the performance degradation of the min sum algorithm. In enhanced min sum algorithm, one would still calculate the minimum instead of the parity for the incoming messages but one would add a correction factor to this minimum value to get the results closer to the actual parity calculations. The actual correction factor is generally obtained empirically through long simulations or through FPGA (field programmable gate array) verification. Provided in the attached figures is a digital implementation of an enhanced MinSum algorithm that can be used for error correction in data communications. A description of the logic functions shown in the attached figures will now be described.

Figure 11:
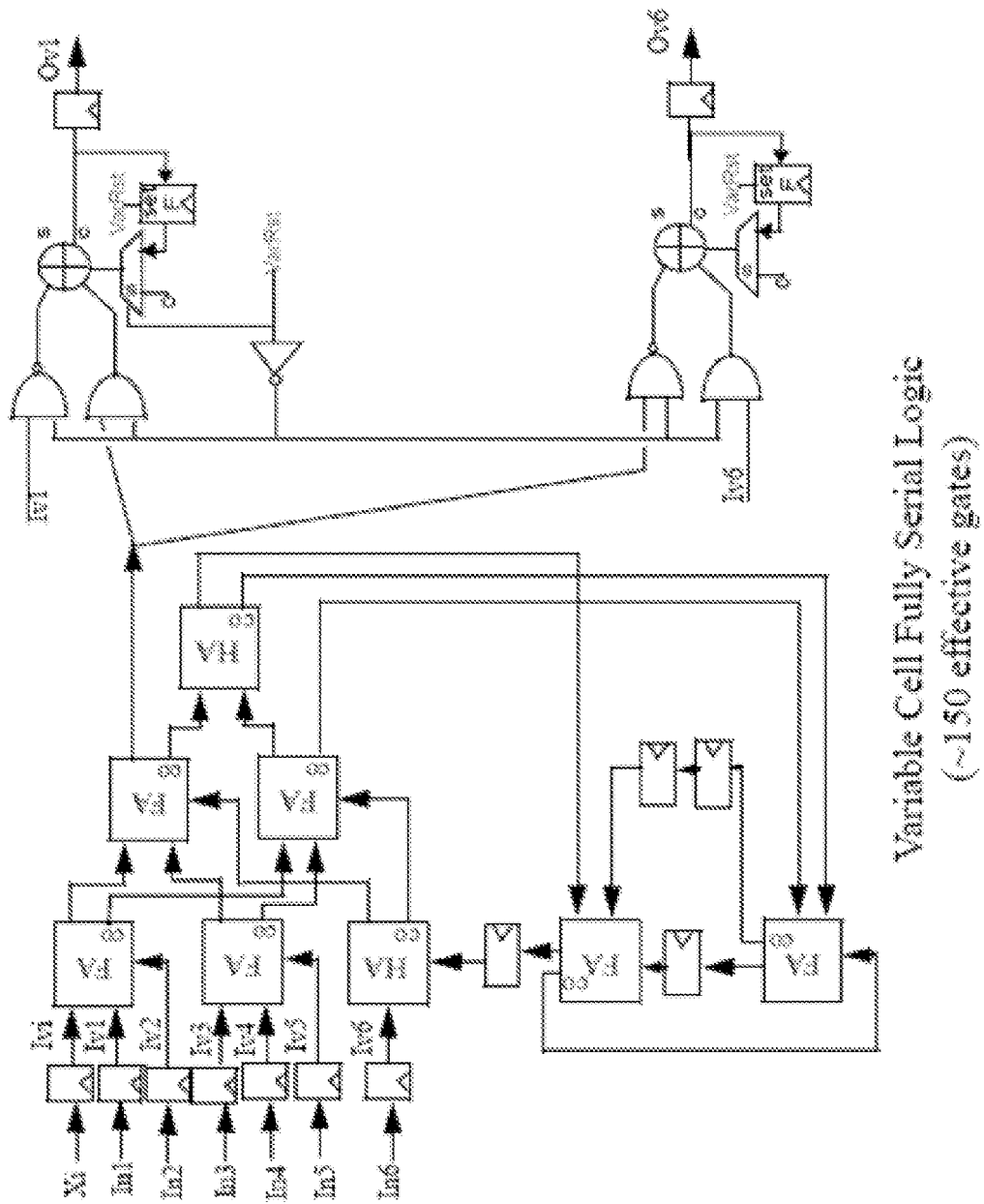
FIG. 11 is a schematic diagram of the Variable cell of FIG. 3 according to one implementation.

FIG. 1 illustrates one implementation of parity logic 100 that can be implemented within an iterative error correcting decoder (e.g., a low density parity check (LDPC) decoder). In one implementation, the parity logic 100 includes difference message passing elements for each output (e.g., Op0-Op 31), that consist of a (store) register 104 to store the last data sent and a XOR gate 106 to determine the difference between the current data and the last data sent. In one implementation, the store register 104 is also updated by the new message value. In one implementation, the whole function of difference message passing is performed serially. In this implementation, serial data from a corresponding Variable cell (e.g., represented by the variable sum logic 300 of FIG. 3, and illustrated in greater detail in FIG. 11) is in Sign-Magnitude format where the Sign and MSB bit come first in the series. The other two logic blocks in the core of the parity logic 100 are the enhanced MinSum serial logic 108 and the sign logic 110. In one implementation, the sign logic 110 is a combinational XOR logic that only works on the sign bits of the input messages and generates the sign bit of the output message for each message.

Figure 2:
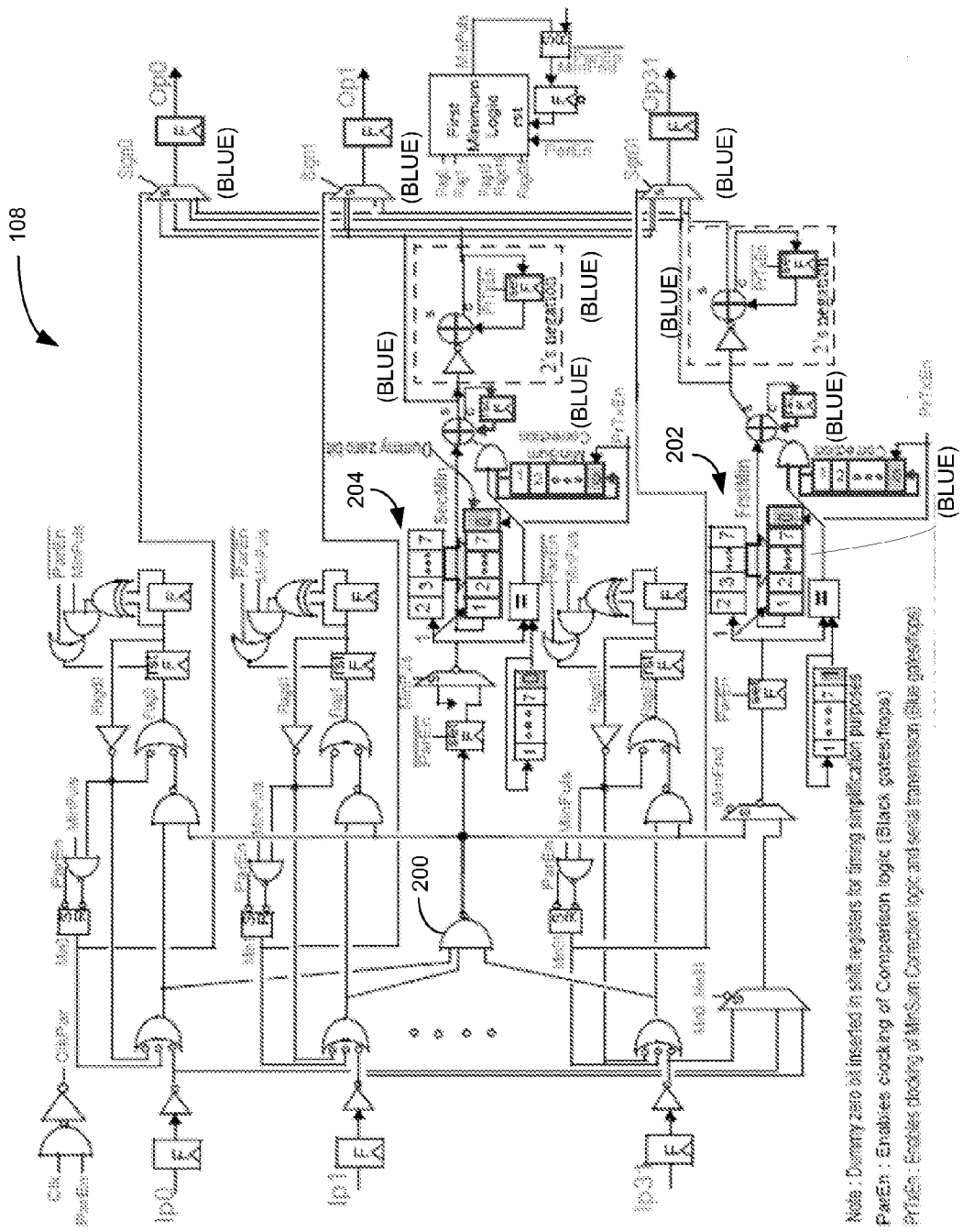
FIG. 2 is a schematic diagram of the enhanced MinSum logic of FIG. 1 according to one implementation.

In one implementation, the logic differential that monitors the magnitude part of the serial data and finds the two inputs with minimum value is built in the enhanced MinSum serial logic 108. FIG. 2 illustrates one implementation of the enhanced MinSum serial logic 108 in greater detail.

Figure 9:
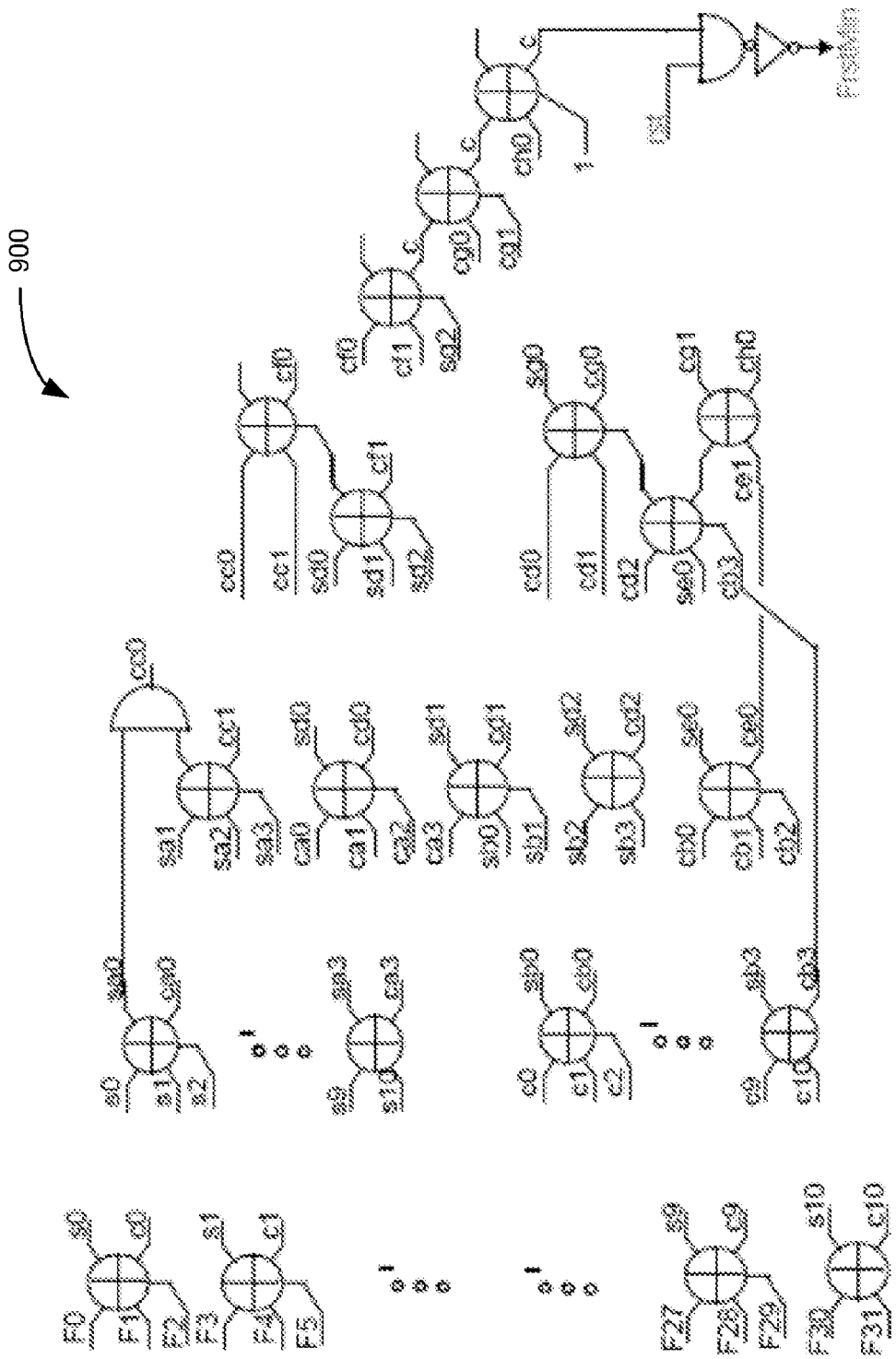
FIG. 9 is a schematic diagram of first minimum detection logic within the enhanced MinSum logic of FIG. 1 according to one implementation.
Figure 10:
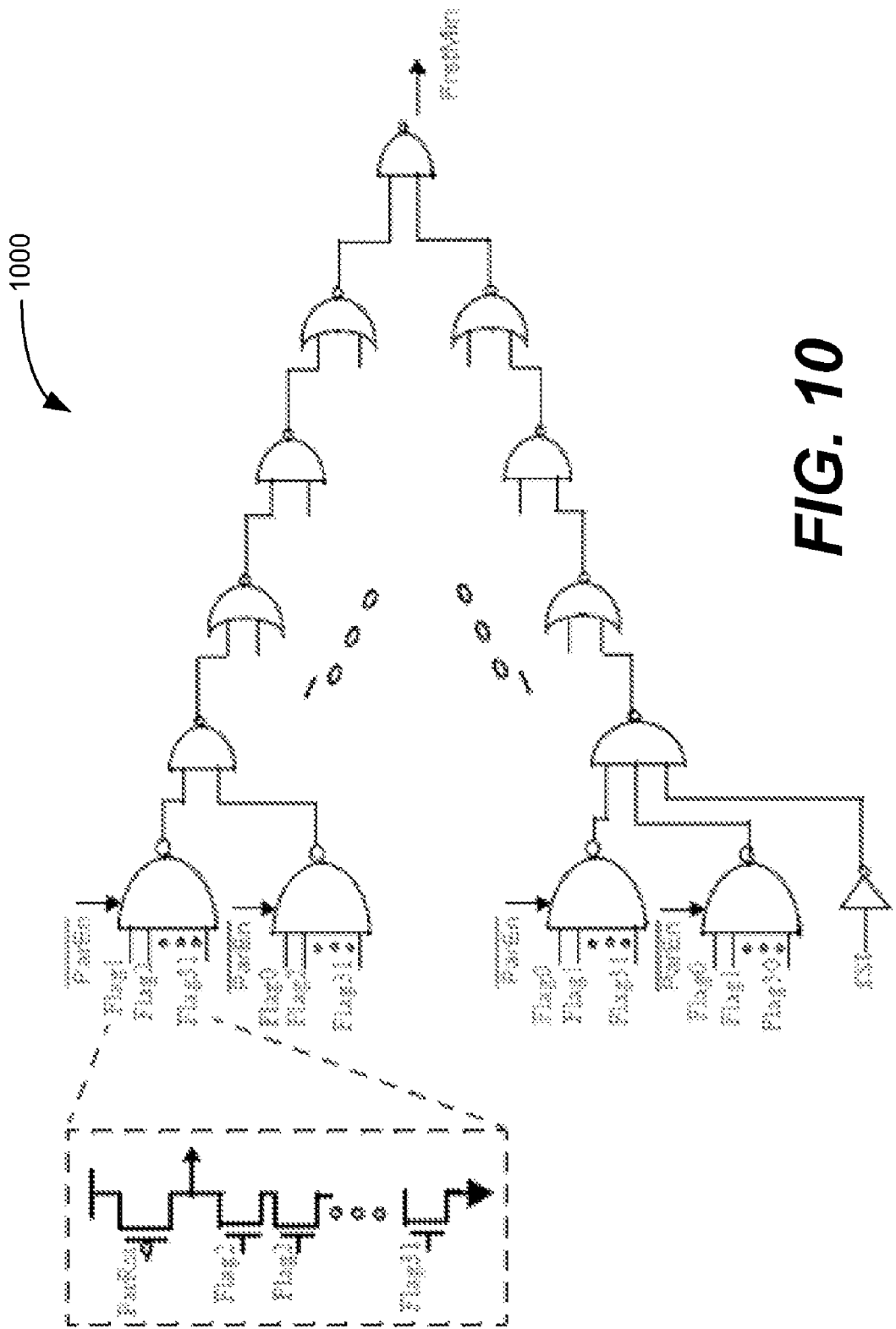
FIG. 10 is a schematic diagram of first minimum detection logic within the enhanced MinSum logic of FIG. 1 according to one implementation.

As shown in FIG. 2, in one implementation, input bits from the Variable cells enter the (parity) MinSum serial logic 108 serially with the MSB first. In one implementation, the enhanced MinSum serial logic 108 monitors bits of same significance that are received (e.g., through each input port Ip0-Ip31) at the same time from all channels. If the respective bits received from one or more channels are one and others are zero, the channels having a current bit equal to one are placed out of the competition by deactivating their path. However, if all channels receive a bit of one, no channel is deactivated and the process continues intact. In one implementation, the MinSum serial logic 108 includes a 32-input NAND gate 200, the output of which is equal to the minimum value (inverted) of all paths for those bits that have been received. The output of the 32-input NAND gate 200 is fed into two registers—i.e., FrstMin register 202 (that will contain first minimum) and SecMin register 204 (that will contain second minimum). This process continues until the MinSum serial logic 108 detects only a single zero for all incoming bits (at a given time). The path with the zero corresponds to the path for absolute minimum. In one implementation, the single zero condition is detected by a logic block called first minimum logic (various implementations of which are illustrated in FIGS. 6, 9, and 10).

Figure 5:
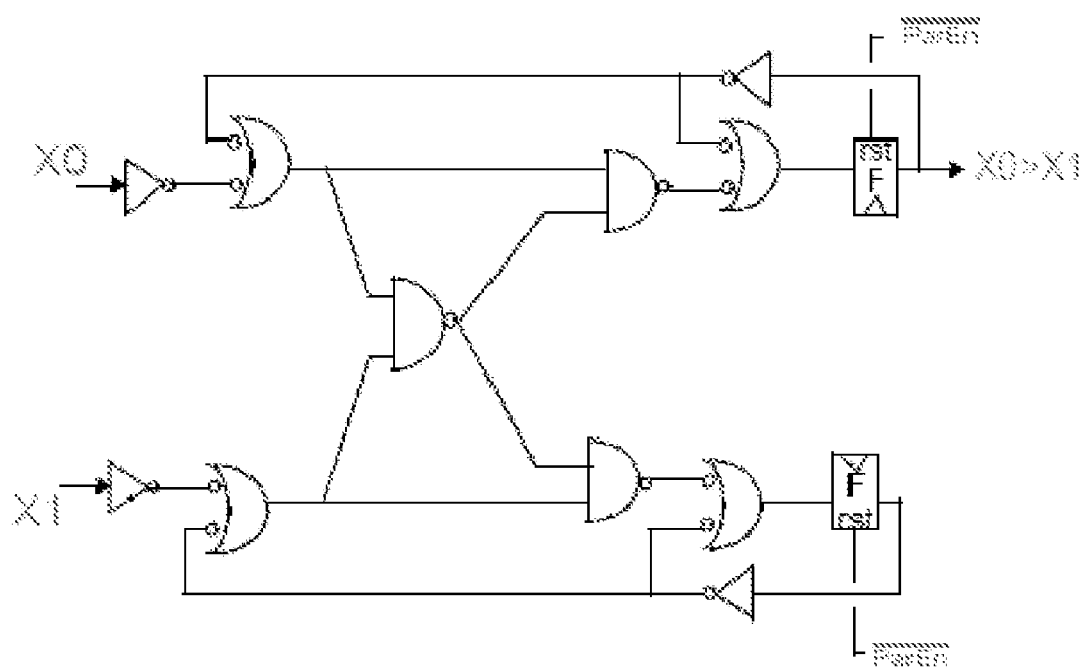
FIG. 5 is a schematic diagram of parity serial comparison logic according to one implementation.
Figure 6:
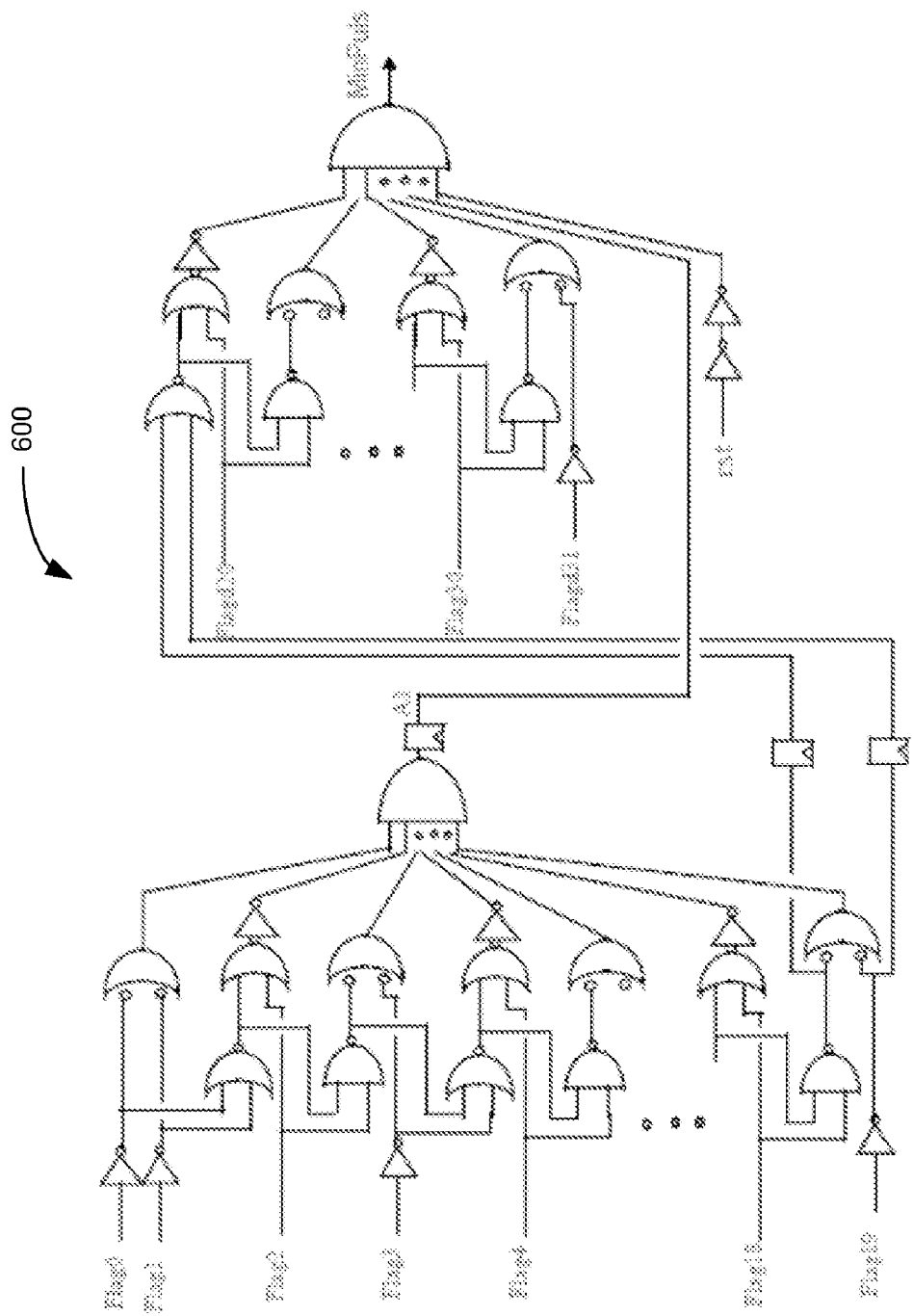
FIG. 6 is a schematic diagram of first minimum detection logic within the enhanced MinSum logic of FIG. 1 according to one implementation.

In particular, FIG. 6 illustrates one implementation of first minimum logic 600 that includes approximately 100 gates and 43 gate delays (spread in 1.5 cycles). FIG. 9 illustrates one implementation of first minimum logic 900 including adders. The first minimum logic 900 includes approximately 63 gates and 17 gate delays, and can be used in a high speed/high power application. In one implementation, the first minimum logic 900 has a maximum delay of less than 1.7 ns. FIG. 10 illustrates one implementation of first minimum logic 1000 that includes 64 gates. In one implementation, the first minimum logic 1000 has a maximum delay of greater than 1.7 ns. FIG. 5 illustrates one implementation of the parity serial comparison logic within the MinSum serial logic 108.

Referring back to FIG. 2, the minimum path is identified and rerouted into the FrstMin register 202 and removed from the competition. At this point all other paths are already deactivated as a zero has been received, belonging to absolute minimum, and all others have been one. At this point, the MinSum serial logic 108 reactivates those paths that had not been deactivated in the previous cycle and enters those paths back into the competition for the determination of the second minimum. In one implementation, identification of the paths that were active during the last cycle is implemented by using an extra flop in each path and an XOR logic to find the paths that were zero in the previous cycle and one in the current cycle. Once the identified paths are back into the competition, the minimum detection logic works on them serially to determine the minimum—i.e., the second minimum—of the remaining paths.

In one implementation, once the first and second minimum values have been determined and are contained within the FrstMin register 202 and the SecMin register 204, an enhancement function is performed on these two values. In one implementation, the enhancement function compares the magnitudes of each of the values within the two registers with a first pre-determined constant value. If a given register value is larger than the first pre-determined constant value, then a second pre-determined constant value is subtracted from the register value, and if a given register value is smaller than the first pre-determined constant value then the register value is passed intact—i.e., with no changes. The sign for each path is incorporated into the outcome for each channel and values (in one implementation) are transmitted in 2's complement format. In one implementation, to save the amount of logic in each path, the 2's complement negation for the two minimums are performed once, and the sign of each bit determines whether the negative or positive 2's complement value is to be used. Note that to transmit to Variable nodes, (in one implementation) LSB bits are sent first.

Figure 3:
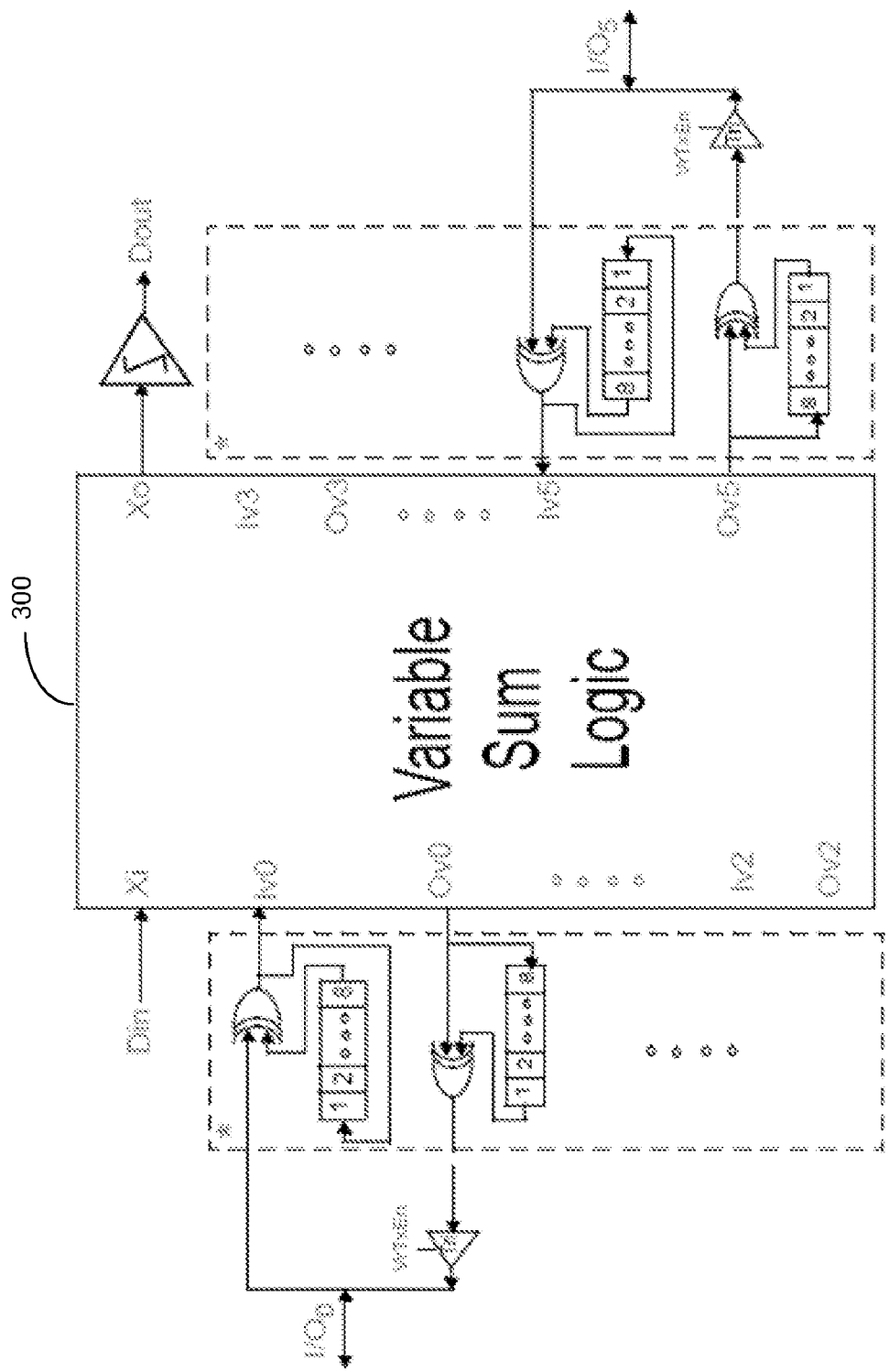
FIG. 3 is a block diagram of a Variable cell according to one implementation.
Figure 4:
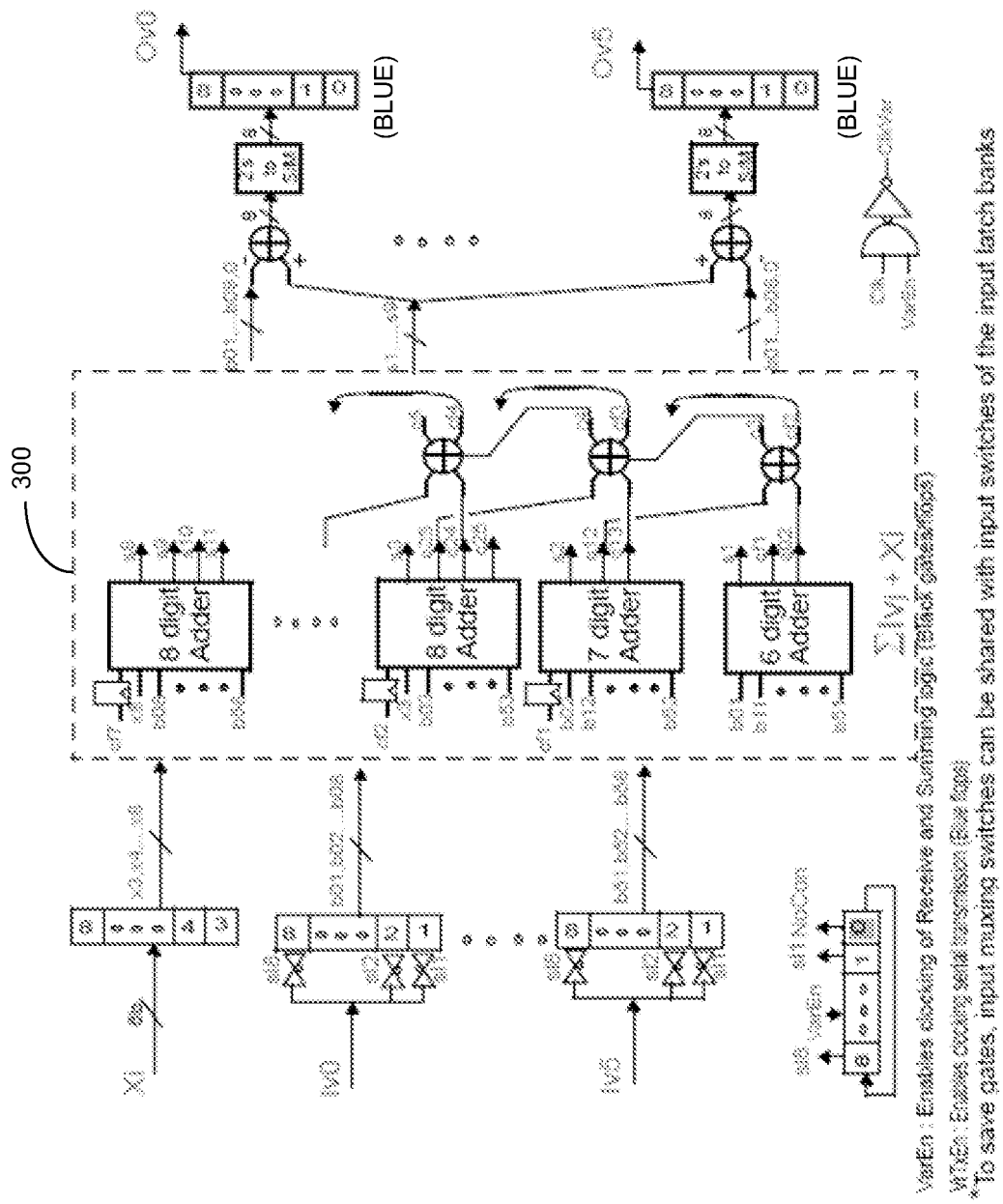
FIG. 4 is a schematic diagram of summing logic within the Variable cell of FIG. 3 according to one implementation.

Referring to FIG. 3, in one implementation, the Variable cell (or variable sum logic 300) receives bits serially and loads the bits into a register (per path) to sum the received bits all together. In one implementation, instead of loading the registers serially as in the case of loading a shift register, the registers are loaded using a 1:N demultiplexer. The demultiplexer loads each incoming bit directly to a corresponding location in the register. Considering that the LSB bits are received first, as soon as the first bit is received, the Variable summing logic (shown in FIG. 4) can start working and have the carry bits ready for the next cycle when the next bit arrives.

Figure 7:
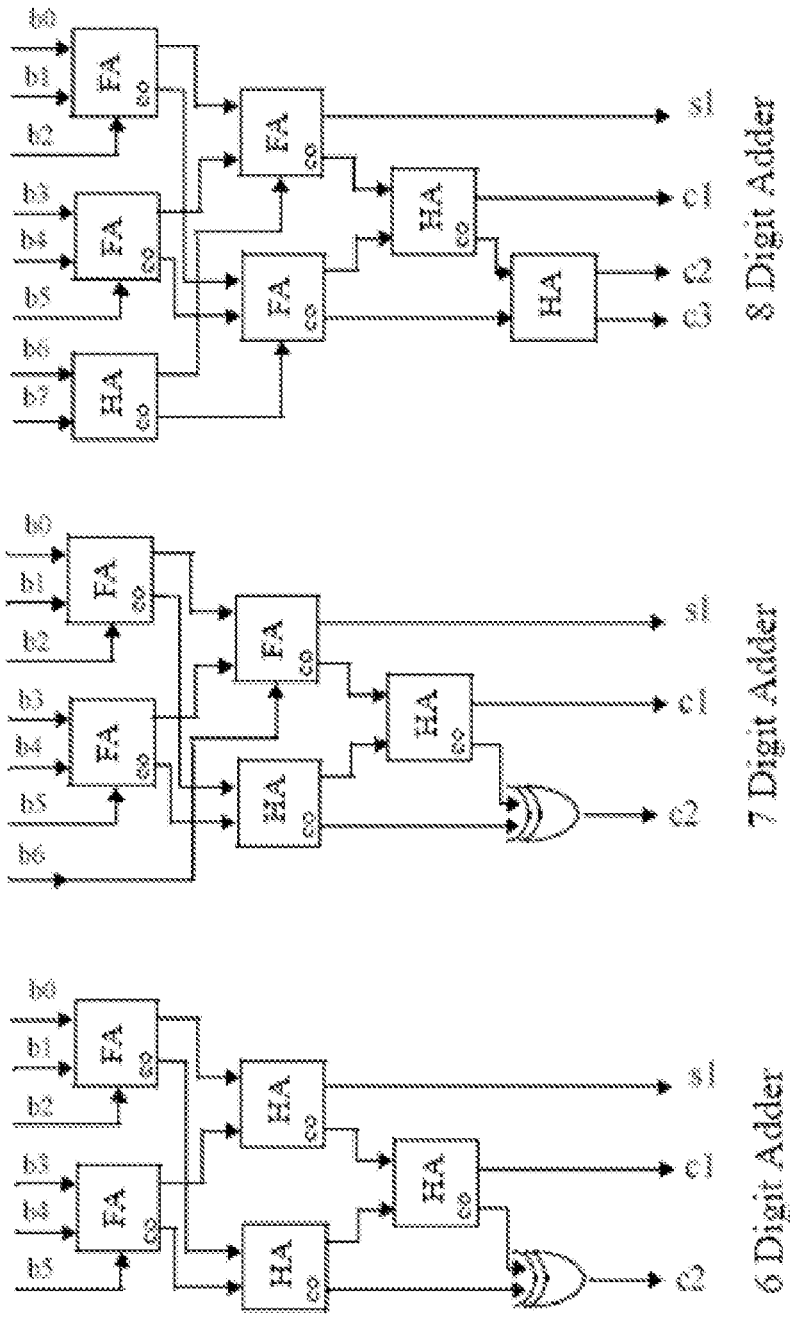
FIG. 7 illustrates one implementation of the adder sub-blocks shown on FIG. 4.
Figure 8:
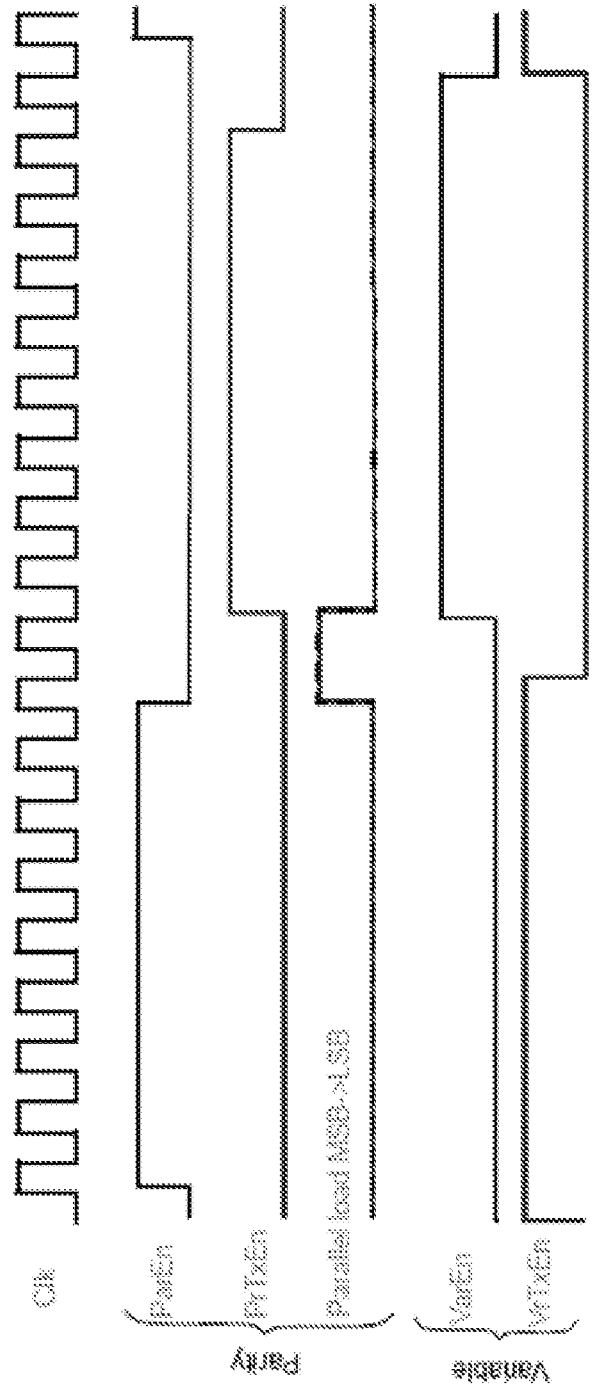
FIG. 8 illustrates an example timing diagram of parity and variable controls.

This implementation has two main advantages, first the logic can be designed with very relaxed timing and, therefore, with minimum gate sizes. In addition, each summing block need only operate once when the proper bits have entered, and can stop switching once processing of those bits have completed. While in the shift register implementation, it takes the LSB "N" cycles (here N=8) to get to its final location and during this process it is exercised by all adders from MSB to LSB, creating lots of false wasted switching. These two advantages create significant power savings, in the range of an order of magnitude for the Variable cell. In one implementation, a flop can be implemented between the carry going from a LSB adder to the next higher adder to reduce the amount of false switching before the rest of the data for the next adder is ready. Finally, after all channels are summed up, to prepare the data to transmit from each path, the value of that path is subtracted from the total sum, then 2's complement to Sign-Mag conversion is done, and finally data is sent with MSB first. One implementation of the 3 different adders sub-blocks (of FIG. 4) are illustrated in FIG. 7. An example timing diagram of the parity and variable controls is illustrated in FIG. 8.

A digital implementation of an enhanced MinSum algorithm has been described. Nevertheless, one of ordinary skill in the art will readily recognize that there that various modifications may be made to the implementation, and those modifications would be within the scope of the present invention. In addition, the implementations described herein can be used in decoders that are compliant with the following standards: IEEE 802.11a/b/g/n, 802.3ae (10 GBASE-T), DVB-S2 (Digital Video Broadcasting)), and the like. Also, the implementations described herein can be applied to iterative error correcting decoders in general. Examples of iterative error correcting decoders (other than LDPC decoders) include Hamming decoders, Reed-Solomon decoders, Turbo decoders, and the like. The implementations described above can also be used in MIMO-OFDMA cellular systems, as well as read-channel for hard discs, and other systems. Accordingly, many modifications may be made by one of ordinary skill in the art without departing from the scope of the present invention.

What is claimed is:

1. An iterative error correcting decoder comprising:
an equality constraint node; and
a parity check node, the parity check node including,
    parity logic configured to receive input data bits from the equality constraint node and determine a first minimum value and a second minimum value associated with the input data bits using a MinSum algorithm,
wherein an enhancement function is performed on the first minimum value and the second minimum value, the enhancement function,
comparing each of the first minimum value and the second minimum value with a first pre-determined constant value; and
responsive to the first minimum value and the second minimum value being smaller than the first pre-determined constant value, the enhancement function passes the first minimum value and the second minimum value without any changes as output of the MinSum algorithm.

2. The iterative error correcting decoder of claim 1, further comprising:
responsive to the first minimum value or the second minimum value being smaller than the first pre-determined constant value, the enhancement function respectively subtracts a second pre-determined value from the first minimum value or the second minimum value prior to passing the first minimum value and the second minimum value as output of the MinSum algorithm.

3. The iterative error correcting decoder of claim 2, wherein the first minimum value and the second minimum value is in 2's complement format.

4. The iterative error correcting decoder of claim 2, wherein the iterative error correcting decoder is one of a low density parity check (LDPC) decoder, a Hamming decoder, a Reed-Solomon decoder, or a Turbo decoder.

5. The iterative error correcting decoder of claim 4, wherein the iterative error correcting decoder is compliant with the IEEE 802.3ae (10 GBASE-T) standard.

6. The iterative error correcting decoder of claim 2, further comprising variable sum logic to serially pass the input data bits to the parity logic.

7. The iterative error correcting decoder of claim 6, wherein the variable sum logic serially passes the input data bits to the parity logic with the most significant bits (MSB) first.

8. The iterative error correcting decoder of claim 6, wherein the variable sum logic comprises a plurality of adders.

9. The iterative error correcting decoder of claim 8, further comprising a flop implemented between a carry going from a least significant bit (LSB) adder to a next higher adder to reduce an amount of false switching prior to all the data for the next higher adder being ready.

* * * * *